US009369142B2

(12) United States Patent
Qiu

(10) Patent No.: US 9,369,142 B2
(45) Date of Patent: Jun. 14, 2016

(54) MULTI-CHANNEL TIME-INTERLEAVED ANALOG-TO-DIGITAL CONVERTER

(71) Applicant: Huawei Technologies Co., Ltd., Shenzhen (CN)

(72) Inventor: Bingsen Qiu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/747,691

(22) Filed: Jun. 23, 2015

(65) Prior Publication Data

US 2015/0381193 A1 Dec. 31, 2015

(30) Foreign Application Priority Data

Jun. 25, 2014 (CN) .......................... 2014 1 0290954

(51) Int. Cl.
*H03M 1/06* (2006.01)
*H03M 1/10* (2006.01)
(Continued)

(52) U.S. Cl.
CPC .......... *H03M 1/0631* (2013.01); *H03M 1/1033* (2013.01); *H03M 1/1215* (2013.01); *H03M 1/0624* (2013.01); *H03M 1/0626* (2013.01); *H03M 1/0836* (2013.01); *H03M 1/1061* (2013.01)

(58) Field of Classification Search
CPC ... H03M 1/06; H03M 1/1215; H03M 1/0836; H03M 1/10; H03M 1/121; H03M 1/164; H03M 1/08; H03M 1/0607; H03M 1/0609; H03M 1/0673; H03M 1/442; H03M 1/1033; H03M 1/1023; H03M 1/1004; H04L 25/08

USPC .................................................. 341/118–155
See application file for complete search history.

(56) References Cited

U.S. PATENT DOCUMENTS 7,250,885 B1 * 7/2007 Nairn ................... H03M 1/1215
                                                              341/141
9,000,962 B1 * 4/2015 Leuciuc .............. H03M 1/1033
                                                              341/120

(Continued)

FOREIGN PATENT DOCUMENTS

CN          103312328 A      9/2013
CN          103516361 A      1/2014
(Continued)

*Primary Examiner* — Lam T Mai
(74) *Attorney, Agent, or Firm* — Leydig, Voit & Mayer, Ltd.

(57) ABSTRACT

The present invention provides a multi-channel time-interleaved analog-to-digital converter, including: a clock generation circuit, configured to generate a work clock of the analog-to-digital converter; a channel ADC group, including M ADC channels, and configured to convert, under the control of the clock generation circuit and in a time division multiplexing manner, one high-speed analog input signal into M low-speed digital output signals; a channel mismatch detection circuit, configured to detect in real time timing skew errors of output signals of the M ADC channels; a signal compensation and reconstruction circuit, configured to perform, according to the timing skew parameters detected, compensation and reconstruction on the digital output signals output by the channel ADC group; and a signal combining circuit, configured to combine the M low-speed output signals that are of the channels and generated after the compensation by the signal compensation and reconstruction circuit.

8 Claims, 6 Drawing Sheets

(51) Int. Cl.
*H03M 1/12* (2006.01)
*H03M 1/08* (2006.01)

(56) References Cited

U.S. PATENT DOCUMENTS

| | | | |
|---|---|---|---|
| 2007/0194960 A1* | 8/2007 | Wang | H03M 1/1004 341/120 |
| 2008/0122673 A1* | 5/2008 | Dyer | H03M 1/1215 341/155 |
| 2008/0291064 A1 | 11/2008 | Johansson et al. | |
| 2011/0001644 A1 | 1/2011 | Messier | |
| 2011/0063149 A1 | 3/2011 | Kidambi | |
| 2011/0102228 A1* | 5/2011 | Anthony | H03M 1/0607 341/155 |
| 2012/0075129 A1 | 3/2012 | Kidambi | |
| 2013/0016798 A1 | 1/2013 | Velazquez et al. | |
| 2013/0241753 A1 | 9/2013 | Nozaki | |
| 2014/0002284 A1 | 1/2014 | Tan et al. | |
| 2014/0266823 A1* | 9/2014 | Biallais | H03M 1/08 341/118 |
| 2014/0369451 A1* | 12/2014 | Wu | H03M 1/164 375/349 |

FOREIGN PATENT DOCUMENTS

| | | |
|---|---|---|
| CN | 104038226 A | 9/2014 |
| CN | 104467844 A | 3/2015 |

* cited by examiner

MULTI-CHANNEL TIME-INTERLEAVED ANALOG-TO-DIGITAL CONVERTER

CROSS-REFERENCE TO RELATED APPLICATION

This application claims priority to Chinese Patent Application No. 201410290954.0, filed on Jun. 25, 2014, which is hereby incorporated by reference in its entirety.

TECHNICAL FIELD

The present invention relates to the field of electronics, and in particular, to a multi-channel time-interleaved analog-to-digital converter.

BACKGROUND

A multi-channel time-interleaved analog-to-digital converter (Multi-channel Time-interleaved Analog-to-Digital Converter) is a high-speed ADC architecture that connects multiple analog-to-digital converters (Analog-to-Digital Converter, ADC) in parallel, and makes, by using staggered clock, the converters alternatively work in a time division multiplexing manner, and can combine low-speed signals, which are output by ADCs that keep working at a low frequency, into a high-speed signal. In an ideal case, when circuit parameters of ADCs of various channels are identical, a sampling rate of a Time-interleaved ADC increases in direct proportion to a quantity of interleaved parallel ADC channels. In fact, it is very difficult to achieve exact matching of sampling time for ADCs of different channels, thereby generating a timing skew error (timing skew error). Without correction, dynamic performance of a Time-interleaved ADC will be severely affected. Therefore, timing skew errors of the ADCs of the channels need to be detected, and after the detection, a foreground correction technology or a background correction technology is used for correction to compensate for the timing skew errors.

SUMMARY

An objective of the present invention is to provide a multi-channel time-interleaved analog-to-digital converter, which can make multiple low-speed ADCs equivalent to one high-speed ADC.

To achieve the foregoing objective, the present invention provides an analog-to-digital converter, where the analog-to-digital converter includes:

a clock generation circuit, configured to generate a work clock of the analog-to-digital converter;

a channel ADC group, including M ADC channels, arranged to be in a time-interleaved architecture, and configured to convert, under the control of the clock generation circuit and in a time division multiplexing manner, one high-speed analog input signal into M low-speed digital output signals, where M is an integer not less than 2;

a channel mismatch detection circuit, configured to detect in real time timing skew errors of output signals of the M ADC channels, to obtain a timing skew parameter of each ADC channel relative to a reference ADC channel;

a signal compensation and reconstruction circuit, configured to perform, according to the timing skew parameters detected by the channel mismatch detection circuit, compensation and reconstruction on the digital output signals output by the channel ADC group; and a signal combining circuit, configured to combine the M low-speed output signals that are of the channels and generated after the compensation by the signal compensation and reconstruction circuit, to obtain one final high-speed digital output signal.

According to the multi-channel time-interleaved analog-to-digital converter in the embodiment of the present invention, the channel mismatch detection circuit further includes:

a notch filter, configured to perform notch filtering on the output signals of the M ADC channels;

a mismatch error discriminator, configured to perform mismatch error discrimination according to an output result of the notch filter;

an alpha filter, configured to perform smooth filtering on the timing skew parameter generated by the mismatch error discriminator; and a mismatch error adaptive iterative circuit, configured to optimize an adaptive error value obtained through the smooth filtering, to obtain a timing skew error steady state value.

According to the multi-channel time-interleaved analog-to-digital converter in the embodiment of the present invention, the notch filter includes:

a first shift register, configured to shift an input signal to the right by 6 bits;

a first delay circuit, configured to delay the input signal by one clock;

a second shift register, configured to shift an output signal of the first delay circuit to the right by 6 bits;

a first subtracter, configured to subtract an output of the first shift register from the input signal;

a second subtracter, configured to subtract an output of the second shift register from an output of the first delay circuit;

a first adder, configured to add an output of the second subtracter to an output of the first subtracter;

a second delay circuit, configured to delay an output signal of the first adder by a clock cycle;

a third shift register, configured to shift an output signal of the second delay circuit to the right by 6 bits;

a third subtracter, configured to subtract an output of the third shift register from an output of the second delay circuit; and a third delay circuit, configured to delay an output of the third subtracter by a clock cycle, and use a delayed output as a final output signal of the notch filter.

According to the multi-channel time-interleaved analog-to-digital converter in the embodiment of the present invention, the mismatch error discriminator includes:

a fourth subtracter, configured to subtract $x'\%_{i-1}(n)$ from a signal $x'\%_{i+1}(n)$ output by the notch filter; and a first multiplier, configured to multiply an output of the fourth subtracter by a signal $\bar{x}'_i(n)$ output by the notch filter, wherein n is time, i=1, 2, . . . , M−1, and M is a natural number not less than 2.

According to the multi-channel time-interleaved analog-to-digital converter in the embodiment of the present invention, the alpha filter includes:

a fifth subtracter, configured to subtract $\delta'_i(n-1)$ from an output signal $\delta'\%_i(n)$ of the mismatch error discriminator;

a second multiplier, configured to multiply an output result of the fifth subtracter by an α factor;

a second adder, configured to add an output of the second multiplier and $\delta'_i(n-1)$; and a fourth delay circuit, configured to delay an output of the second adder by a clock cycle.

According to the multi-channel time-interleaved analog-to-digital converter in the embodiment of the present invention, the mismatch error adaptive iterative circuit includes:

a first operation circuit, configured to take a maximum value of a mismatch error value $\delta'_i$ of each channel output by the alpha filter;

a second operation circuit, configured to take the reciprocal of an output result of the first operation circuit;

a fifth delay circuit, configured to delay an output result of the second operation circuit by a clock cycle;

a third multiplier, configured to multiply an output of the fifth delay circuit by an output signal $\delta'_i(n)$ of the alpha filter;

a sixth delay circuit, configured to delay an output result of the third multiplier by a clock cycle;

a fourth multiplier, configured to multiply an output result of the sixth delay circuit by a constant $\mu$;

a third adder, configured to add an output of the fourth multiplier to an output at a previous moment of the mismatch error adaptive iterative circuit; and a seventh delay circuit, configured to delay an output result of the third adder by a clock cycle, and use a delayed output result as a final timing skew error steady state value $\delta_i(n)$.

According to the multi-channel time-interleaved analog-to-digital converter in the embodiment of the present invention, the analog-to-digital converter further includes an energy detector, where the energy detector is configured to perform an absolute value operation on an output value of the reference channel, then subtract a set threshold after performing filtering by using the alpha filter, and transmit, as a final output to the mismatch error discriminator, a symbol of an operation result obtained after the set threshold has been subtracted, where when a high level is output, the mismatch error discriminator works normally, and when a low level is output, a current parameter is blocked, and a previous discrimination value is used.

According to the multi-channel time-interleaved analog-to-digital converter in the embodiment of the present invention, the analog-to-digital converter further includes a timing control circuit, configured to control a work process of the analog-to-digital converter.

The embodiment of the present invention provides an analog-to-digital converter, where there is no special requirement for a spectrum of an input signal, a sampling frequency of an ADC of each channel does not need to individually meet the Nyquist criterion; instead, in a case in which an equivalent sampling frequency output by a combination in a time-interleaved ADC meets the Nyquist criterion, a timing skew error of a channel can be accurately calculated, and correction and compensation are performed on a signal generated by an ADC of each channel, to output a correct signal.

DESCRIPTION OF EMBODIMENTS

The technical solutions of the present invention are further described below in detail with reference to the accompanying drawings and embodiments.

Figure 1:
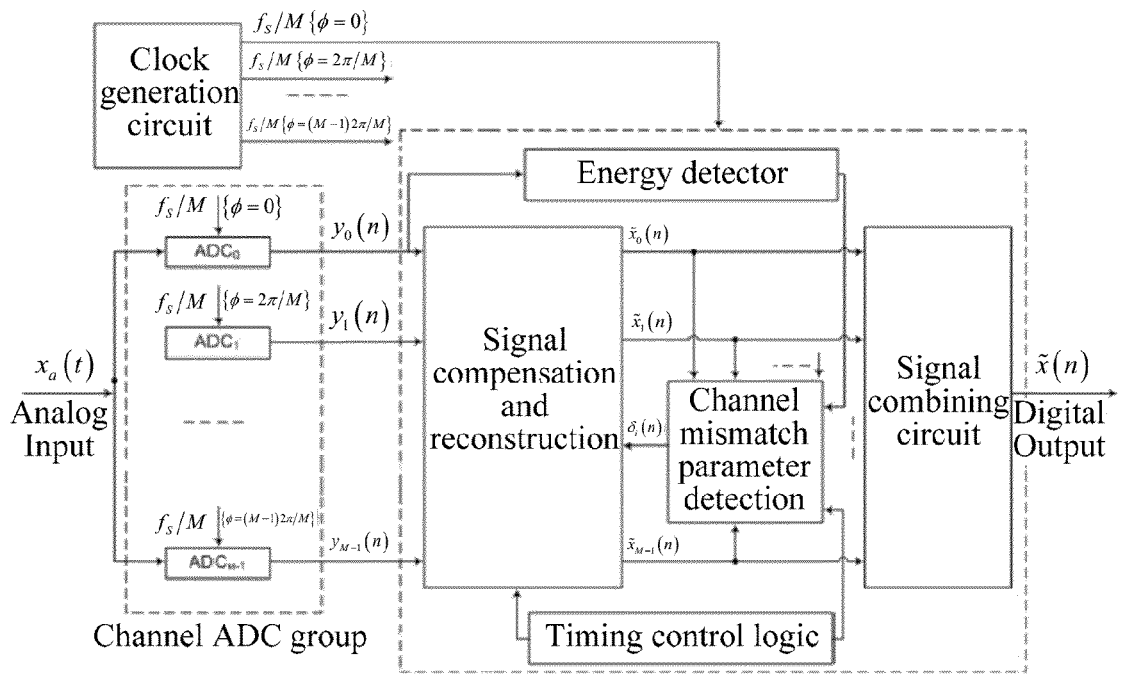
FIG. 1 is a principle block diagram of an M-channel time-interleaved analog-to-digital converter according to an embodiment of the present invention.

As shown in FIG. 1, an embodiment of the present invention provides an analog-to-digital converter, where the analog-to-digital converter is a multi-channel time-interleaved analog-to-digital converter. It can be seen from FIG. 1 that the analog-to-digital converter includes an M-channel ADC group, a clock generation circuit, a channel mismatch parameter detection circuit, a signal compensation and reconstruction circuit, and a signal combining circuit.

The clock generation circuit is configured to generate a work clock of the analog-to-digital converter. The M-channel ADC group includes ADCs of M channels, where M is a natural number not less than 2. These ADCs are arranged to be in a time-interleaved architecture, and under the control of the clock generation circuit, these ADCs alternatively work in a time division multiplexing manner by using a staggered clock, to convert an analog input signal into a digital output signal, where sampling clocks of ADCs of adjacent subchannels in M ADC channels have a phase difference of $2\pi/M$.

The channel mismatch detection circuit is configured to perform real-time detection on timing skew errors of output signals of the M ADC channels, to obtain a timing skew parameter of each ADC channel relative to a reference ADC channel.

The signal compensation and reconstruction circuit is configured to perform, according to a detection result of the channel mismatch detection circuit, compensation and reconstruction on output signals of the M channels, where the output signals obtained after compensation and reconstruction are sent to the signal combining circuit; and configured to combine the M low-speed output signals that are of the channels and generated after the compensation by the signal compensation and reconstruction circuit, to obtain one final high-speed digital output signal.

The one final high-speed digital output signal of a design sampling frequency is obtained through combination in the signal combining circuit, and is used as a final output signal of the analog-to-digital converter. The signal compensation and reconstruction circuit may be implemented in a digital manner, or may be implemented in an analog circuit manner.

Figure 2:
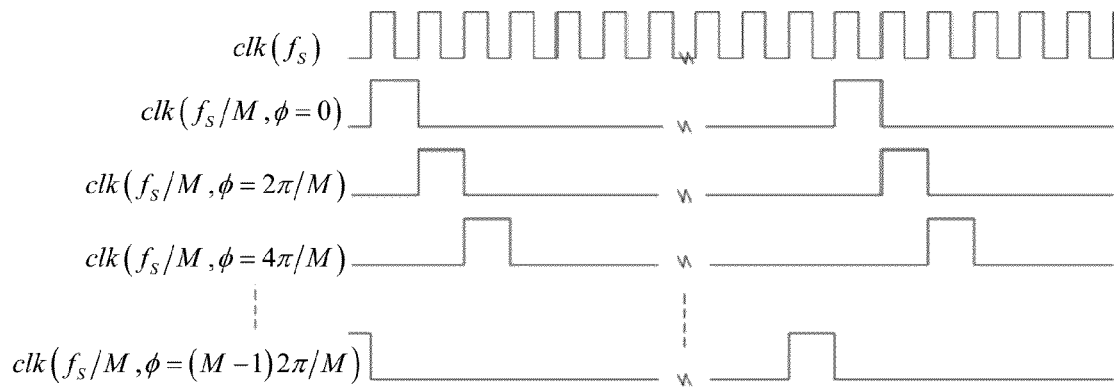
FIG. 2 is a clock timing diagram generated by an ADC of each channel and a combined output clock timing diagram according to an embodiment of the present invention.

In this embodiment of the present invention, as shown in FIG. 2, it is assumed that the clock generation circuit generates M clocks clk($f_s$/M, $\phi$=0), clk($f_s$/M, $\phi$=2$\pi$/M), ..., clk($f_s$/M, $\phi$=(M−1)2$\pi$/M) with a frequency of $f_s$/M and a phase difference of 2$\pi$/M, and the M clocks are used as sampling clocks for an $ADC_0$, $ADC_1$, ..., and $ADC_{M-1}$ in the M-channel ADC group. In this way, sampling time is staggered for the ADCs of the M channels, and the ADCs of the M channels convert, in a time division multiplexing and alternate work manner, an analog input signal into a digital output signal with an equivalent sampling frequency of $f_s$.

In FIG. 2, for ease of description, sampling clocks of ADCs of subchannels are described as a pulse form. In fact, the sampling clocks of the ADCs of these subchannels are rectangular waves with a frequency of $f_s$/M. In an ideal case, when circuit parameters of the ADCs of the M channels are all the same, a sampling rate of a time-interleaved ADC increases to M times, that is, increasing from $f_s$/M to $f_s$. However, due to process deviations, it is very difficult to achieve exact matching of sampling time for ADCs of the M channels. In other words, a phase difference between two adjacent ADCs is constantly kept at 2$\pi$/M, thereby generating a timing skew error (timing skew error). In addition, the timing skew error may further change with temperature drift or a change of supply voltage or another environmental condition. If the timing skew error is not corrected, dynamic performance of a time-interleaved ADC is severely affected.

In an embodiment, it is first assumed that ADC0 is a reference channel, and a sampling clock clk($f_s$/2, $\phi$=0) of ADC0 has a precise zero phase. Therefore, an actual value $\Delta T_i$ by which a sampling clock clk($f_s$/M, $\phi$=2i$\pi$/M) of $ADC_i$ (i=1, 2, ..., M−1) of a channel deviates from an ideal phase 2i$\pi$/M is a timing skew error. For convenience, measurement is performed by using a "normalized timing skew error", which is defined as $$\delta_i(n) = \frac{\Delta T_i}{T_S}$$

where $$T_S = \frac{1}{f_S}$$

is an equivalent sampling clock cycle of a time-interleaved ADC; and n is time, and introduction of n indicates that the timing skew error has a time varying characteristic.

With reference to the structural block diagram of the analog-to-digital converter shown in FIG. 1, a role of a channel mismatch parameter detection circuit in this embodiment of the present invention is to detect a timing skew error $\delta_i(n)$ (i=1, 2, ..., M−1) between ADCs of channels. The signal compensation and reconstruction circuit performs, according to the error parameter value detected by the channel mismatch parameter detection circuit, compensation and reconstruction processing on the signals output by the channel ADC group; and the signals output by the signal compensation and reconstruction circuit are sent to the signal combining circuit, and are combined to obtain a high-speed signal with an equivalent sampling frequency of $f_s$, which is used as an output of an entire system.

Optionally, to ensure that the channel mismatch parameter detection circuit can still work normally in a case in which an input signal is suddenly interrupted, an energy detector (Energy Detector) may further be set. Similarly, to control a work process of the entire system, a timing control circuit (Control Logic) may be set. The energy detector and the timing control circuit may both be seen as auxiliary units of the channel mismatch parameter detection circuit.

Figure 3:
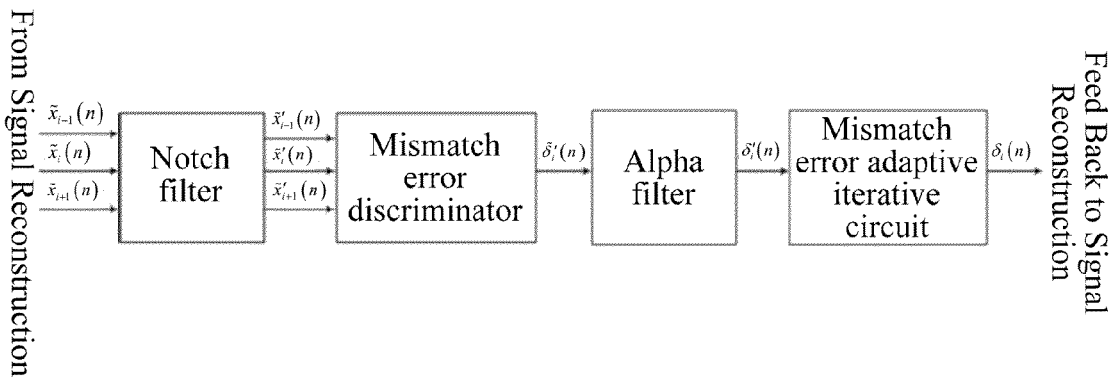
FIG. 3 is a structural diagram of a channel mismatch parameter detection circuit according to an embodiment of the present invention.

Further, as shown in FIG. 3, FIG. 3 is a principle block diagram of a channel mismatch parameter detection circuit in this embodiment of the present invention. The circuit is configured to detect a timing skew error, or referred to as n channel mismatch error (channel Mismatch), of an $ADC_i$ (i=1, 2, ..., M−1) of a subchannel, where ADC0 of a subchannel is a reference channel. The channel mismatch parameter detection circuit includes a notch filter (notch filter), a mismatch error discriminator, an alpha (alpha) filter, and a mismatch error adaptive iterative circuit. For the channel mismatch parameter detection circuit, input data comes from the signal compensation and reconstruction circuit, and an output is fed back to the signal compensation and reconstruction circuit to form a closed loop.

For an M-channel time-interleaved ADC, to detect the timing skew error of the subchannel $ADC_i$ (i=1, 2, ..., M−1), output signals $x_{i-1}(n)$, $x_i(n)$, and $x_{i+1}(n)$ of $ADC_{i-1}$, $ADC_i$, and $ADC_{i+1}$ are first sent to the notch filter, where $x_M(n)=x_0(n+1)$. A function of the notch filter is to filter out an input signal with a frequency of $$\frac{kf_S}{2M},$$

where k=1, 2, ..., M−1, and $f_s$ is an equivalent sampling frequency of the M-channel time-interleaved ADC. Theoretically, it can be proved that, for the M-channel time-interleaved ADC, a $$\frac{kf_S}{2M}$$

frequency component of the input signal plays a misleading role on detection of a channel mismatch error, and must be controlled.

Figure 4:
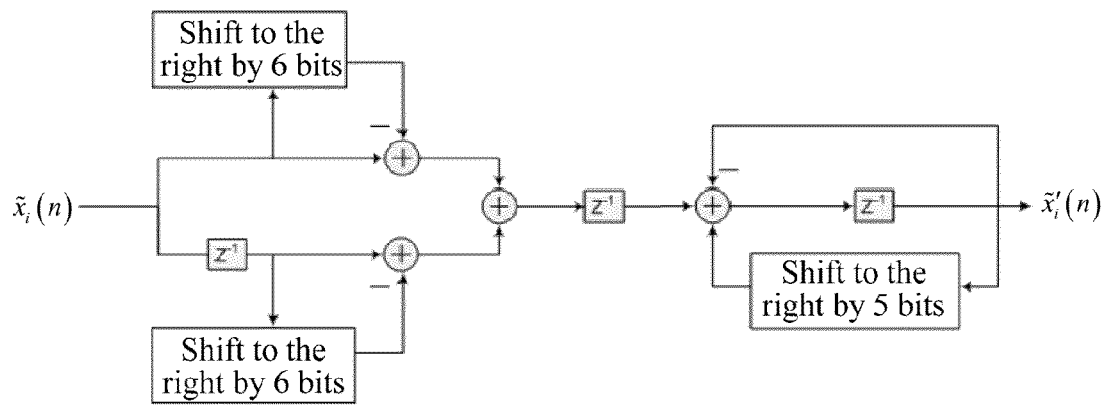
FIG. 4 is a principle diagram of a notch filter in a channel mismatch parameter detection circuit according to an embodiment of the present invention.

In this embodiment of the present invention, a transfer function of the notch filter is:

$$H(z) = \frac{0.984375(1 + Z^{-1})}{1 + 0.96875Z^{-1}}$$

where, $Z^{-1}$ indicates a delay by one beat (clock cycle), and the foregoing formula may further be represented as follows by using a difference equation:

$$\tilde{x}'_i(n) = -0.96875\tilde{x}'_i(n-1) + 0.98475\tilde{x}_i(n) + 0.984375\tilde{x}_i(n-1)$$

$$= [2^{-5}\tilde{x}'_i(n-1) - \tilde{x}'_i(n-1)] + [\tilde{x}_i(n) - 2^{-6}\tilde{x}_i(n)] +$$

$$[\tilde{x}_i(n-1) - 2^{-6}\tilde{x}_i(n-1)]$$

where, a specific VLSI circuit implementation of the $i^{th}$ channel notch filter is shown in FIG. 4. It can be seen that, an implementation of the notch filter in the present invention includes a shift register that performs an operation of shifting an input signal to the right, a delay circuit that delays a signal by one clock, and several adders. In this embodiment, only addition and shifting are required, a multiplier is not required, and therefore hardware costs are low.

Outputs $\tilde{x}'_{i-1}(n)$, $\tilde{x}'_i(n)$, and $\tilde{x}'_{i+1}(n)$ of the notch filter are directly sent to the mismatch error discriminator for performing specific work of detecting a channel mismatch error.

Figure 5:
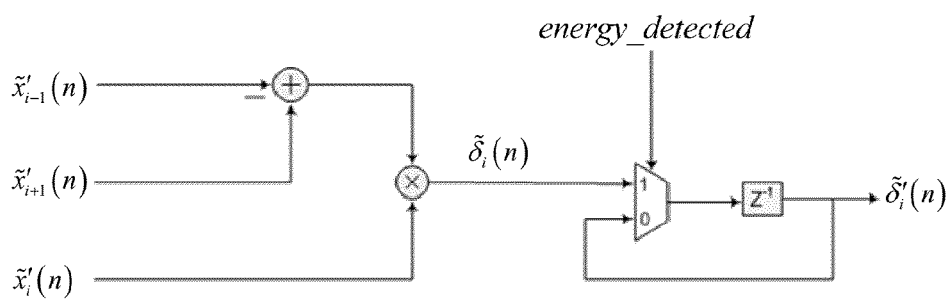
FIG. 5 is a principle diagram of a mismatch error discriminator of 0 to (M−2) channels in a channel mismatch parameter detection circuit according to an embodiment of the present invention.

In the M-channel time-interleaved ADC, a transient estimate $\tilde{\delta}_i(n)$ of a normalized timing skew error of the $i^{th}$ (i=1, 2, . . . , M−2) channel may be measured by using the following formula:

$\tilde{\delta}_i(n) = \tilde{x}'_i(n) \cdot [\tilde{x}'_{i+1}(n) - \tilde{x}'_{i-1}(n)]$, where reference may be made to FIG. 5 for a specific implementation circuit of the formula, which mainly is formed by an adder, a multiplier, a data selector, and a delay circuit.

Figure 6:
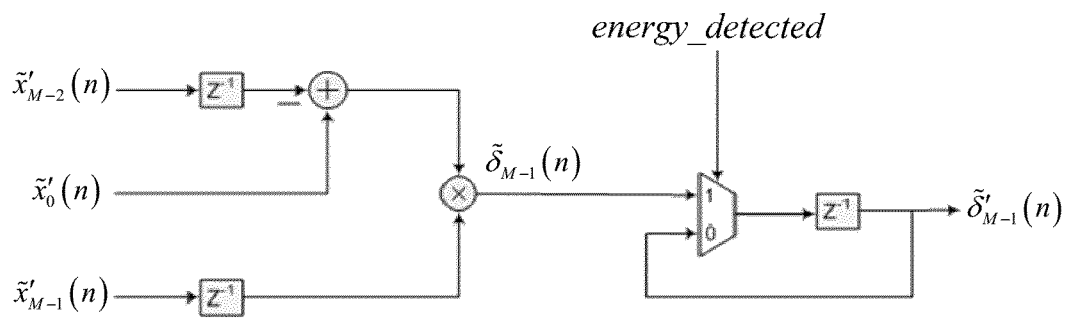
FIG. 6 is a principle diagram of a mismatch error discriminator of an ADC of the $(M-1)^{th}$ channel in a channel mismatch parameter detection circuit according to an embodiment of the present invention.

An calculation formula for a transient estimate $\tilde{\delta}_{M-1}(n)$ of a normalized timing skew error of the $(M-1)^{th}$ channel is represented as $$\tilde{\delta}_{M-1}(n) = (n-1) \cdot [\tilde{x}'_0(n) - \tilde{x}'_{M-2}(n-1)]$$

where a specific circuit implementation of the formula is shown in FIG. 6, and mainly is formed by an adder, a multiplier, a data selector, and a delay circuit.

In FIG. 5 and FIG. 6, an energy detected signal is a control signal output by the energy detector (Energy Detector). A role of the energy detector is to ensure that a channel mismatch parameter detection apparatus can still work normally in a case in which an input signal is suddenly interrupted, and a specific implementation circuit of the energy detector is described below.

Figure 7:
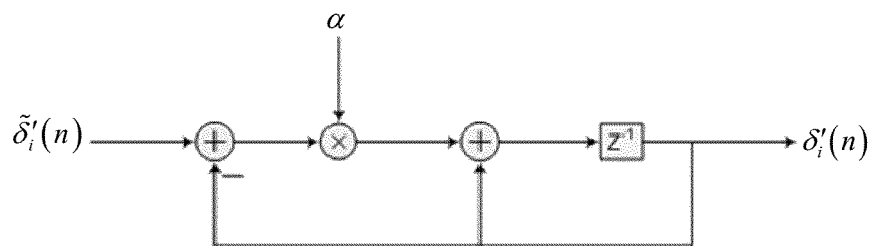
FIG. 7 is a principle diagram of an implementation manner of an alpha filter in a channel mismatch parameter detection circuit according to an embodiment of the present invention.

A transient estimate $\tilde{\delta}_i(n)$, which is obtained by the mismatch error discriminator, of a normalized timing skew error of the $i^{th}$ (i=1, 2, . . . , M−1) channel is marked as $\hat{\delta}'_i(n)$ after being controlled by the energy detector, and then is sent to the alpha filter for smooth filtering, to become $\delta'_i(n)$. The alpha filter in the present invention may be described by using a mathematical formula as $$\delta'_i(n) = \delta'_i(n-1) + \alpha \cdot [\hat{\delta}'_i(n) - \delta'_i(n-1)]$$

where, an appropriate value is used as a parameter value α as required. A specific circuit implementation is shown in FIG. 7, and the circuit includes an adder, a multiplier, and one delay circuit.

The mismatch error value $\delta'_i(n)$ on which the alpha filter has performed smoothing is sent to the adaptive iterative circuit for update and optimization and is turned into a steady state value $\delta_i(n)$. A normalized LMS algorithm is used in the adaptive iterative circuit in the present invention, and the adaptive iterative circuit may be described by using a mathematical formula as follows:

$$\delta_i(n+1) = \delta_i(n) + \mu \cdot \frac{\delta'_i(n)}{\max\{\delta'_i\}}$$

Figure 8:
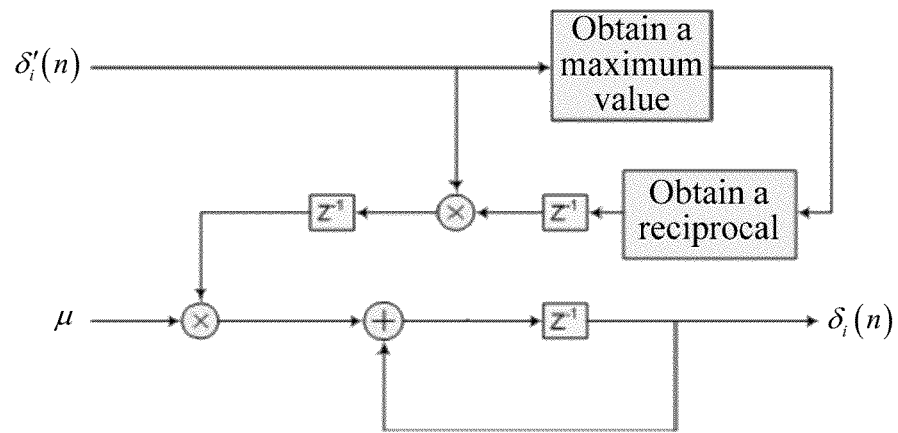
FIG. 8 is a principle diagram of a mismatch error adaptive iterative circuit in a channel mismatch parameter detection circuit according to an embodiment of the present invention.

The adaptive iterative circuit may be implemented by using the circuit shown in FIG. 8. An appropriate value is used as a parameter value µ as required. $\max\{\delta'_i\}$ indicates an operation of taking the maximum value of the mismatch error $\delta'_i(n)$.

Finally, the timing skew error steady state value $\delta_i(n)$, i=1, 2, . . . , M−1 obtained by the channel mismatch parameter detection circuit is fed back to the signal compensation and reconstruction circuit for performing an actual correction on data of an ADC of a channel, and then is combined by the signal combining circuit to obtain a high-speed signal $\tilde{x}(n)$ with an equivalent sampling frequency of $f_s$, which is used as an output of the entire M-channel time-interleaved ADC.

Figure 9:
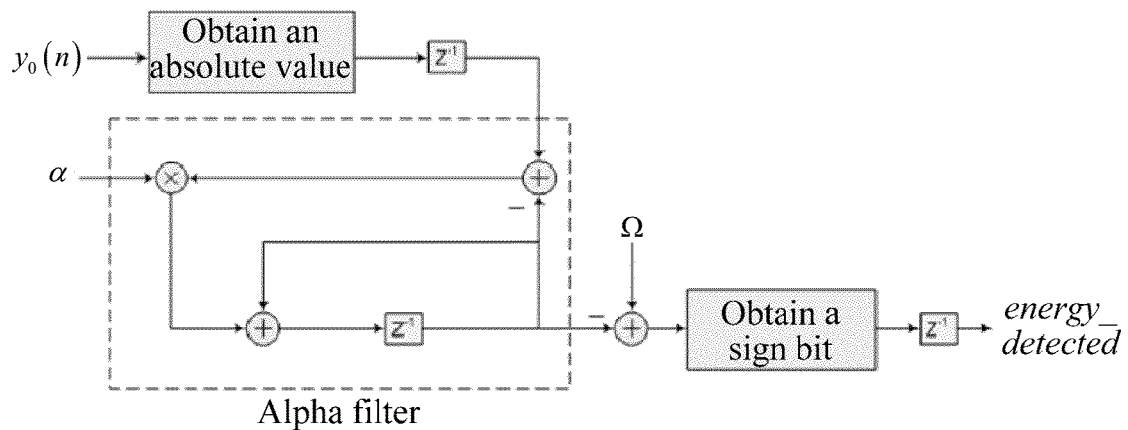
FIG. 9 is a principle diagram of an energy detector according to an embodiment of the present invention.

With reference to the foregoing embodiment, in some communications systems, a case in which signal transmission is suddenly interrupted occurs sometimes. For example, in the IEEE 802.3az Energy Efficient Ethernet, when the system enters an energy saving mode, only LPI signals with an interval of 24 us are transmitted on a cable. In this case, a channel mismatch error detection circuit performs misjudgment without obtaining enough signal excitation. To avoid such a case from occurring, an energy detector is introduced into the present invention, and an implementation principle of the energy detector is shown in FIG. 9. An appropriate value is used as a parameter value Ω as required.

The energy detector directly performs an operation of taking an absolute value of output data of the channel ADC0, subsequently performs smooth filtering by using one alpha filter, and then subtracts one specific threshold, where a sign bit of an operation result is used as a final output, which is then sent to the mismatch error discriminator in FIG. 6. When the energy detector outputs a high level, the mismatch error discriminator works normally; when the energy detector outputs a low level, a current parameter is blocked and a previous discrimination value is used. In this way, the channel mismatch error detection circuit in the present invention can still run normally in a case in which an input signal is suddenly interrupted.

Figure 10:
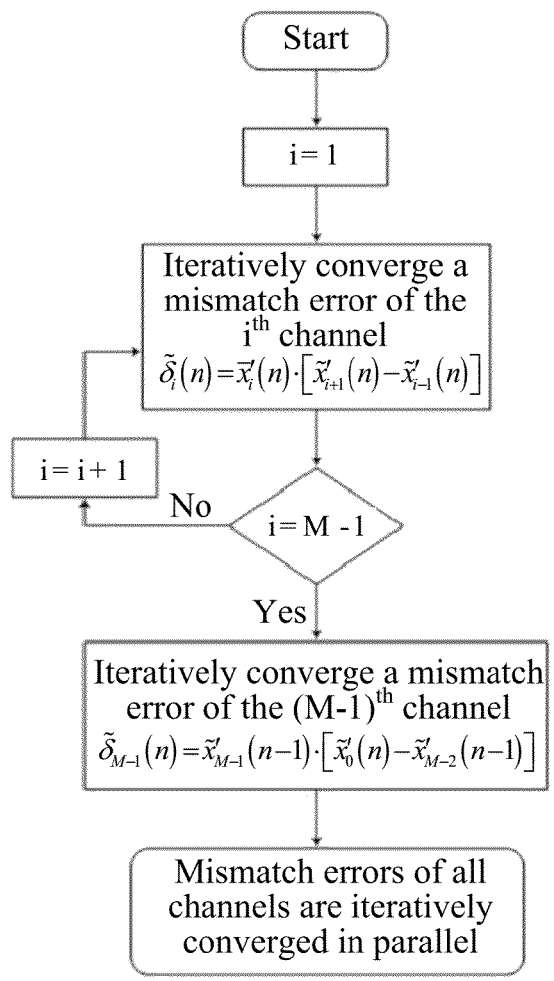
FIG. 10 is a schematic principle diagram of a timing control logic circuit according to an embodiment of the present invention.

To enable the channel mismatch parameter detection circuit to work more efficiently, a timing control circuit is introduced into the present invention, and a principle of the timing control circuit is shown in FIG. 10. For the M-channel time-interleaved ADC, the timing control circuit first controls the channel mismatch error detection circuit to iteratively converge, in a sequence of channels i=1, 2, . . . , M−2, mismatch parameters of the channels in turn, and finally iteratively converge a mismatch parameter of the $(M-1)^{th}$ channel. After all mismatch parameters are converged, the timing control circuit controls mismatch parameter detection circuits of all channels to work in parallel, to allow mismatch error parameters of all channels to be iteratively updated and optimized, so as to trace a time varying feature of the timing skew error in real time.

By using a procedure in FIG. 10 of this patent, a person skilled in the art inserts necessary control logic into the channel mismatch parameter detection circuit very easily.

For the analog-to-digital converter provided in the embodiment of the present invention, there is no special requirement for a spectrum of an input signal, only an equivalent sampling frequency in the time-interleaved ADC needs to meet the Nyquist criterion, and a sampling frequency of an ADC of each channel does not need to individually meet the Nyquist criterion.

In addition, as shown in FIG. 2, for the M-channel time-interleaved ADC with an equivalent sampling frequency of $f_s$, all operation circuit units in the present invention work in a low-speed environment whose clock frequency is $f_s/M$, and have advantages such as easy implementation and low power consumption.

After mismatch parameters are detected by using the channel mismatch parameter detection circuit provided in the foregoing embodiment, the mismatch parameters are fed back to the signal compensation and reconstruction circuit, to perform compensation and reconstruction on an ADC output signal of each channel. The signal compensation and reconstruction circuit not only may be implemented by using a digital circuit, but also may be implemented by using an analog circuit. If the signal compensation and reconstruction circuit performs compensation and reconstruction in a digital domain, a pure digital background correction technology of the multi-channel time-interleaved ADC is formed in this way. In the digital domain, the signal compensation and reconstruction circuit may be implemented by using one digital filter group, or a same function may also be accomplished by using a group of digital interpolation circuits.

The pure digital background correction technology can scale down (scaling-down) according to a semiconductor process size, has advantages of desirable flexibility and a high level of integration, and has an attractive prospect for development.

Figure 11:
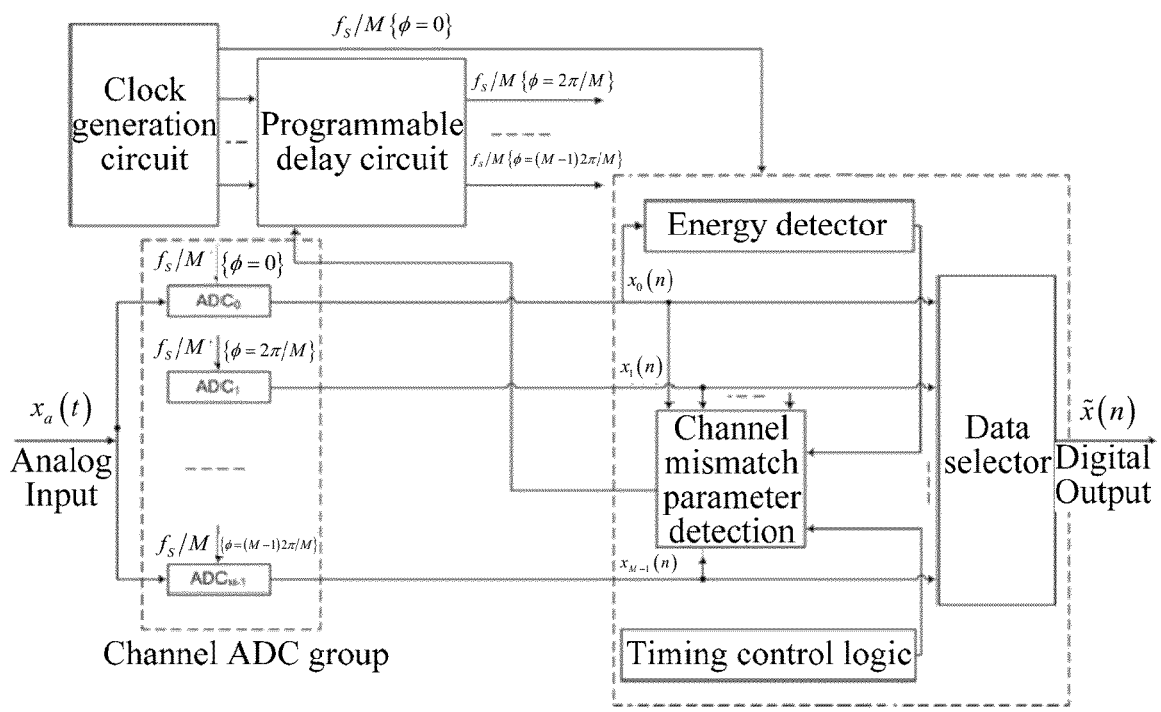
FIG. 11 is a schematic block diagram of another embodiment of an analog-to-digital converter according to an embodiment of the present invention.

Optionally, in the multi-channel time-interleaved ADC, the signal compensation and reconstruction circuit may also be implemented by using an analog circuit. An implementation case of the present invention in which a "signal compensation and reconstruction" function is implemented on the basis of the analog circuit, that is, a so-called digital-analog hybrid background correction technology, is shown in FIG. 11.

In the digital-analog hybrid background correction technology, a function of the signal compensation and reconstruction circuit may be implemented by using a programmable delay circuit. The programmable delay circuit converts, by using a DAC (analog-to-digital converter), a mismatch error parameter value output by the channel mismatch parameter detection circuit into an analog electrical quantity, and furthermore transforms the analog electrical quantity into a delay unit, to fine-tune phases of clocks generated by the "clock generation circuit", and finally offset timing skew errors of sampling clocks of ADCs of various channels.

Figure 12:
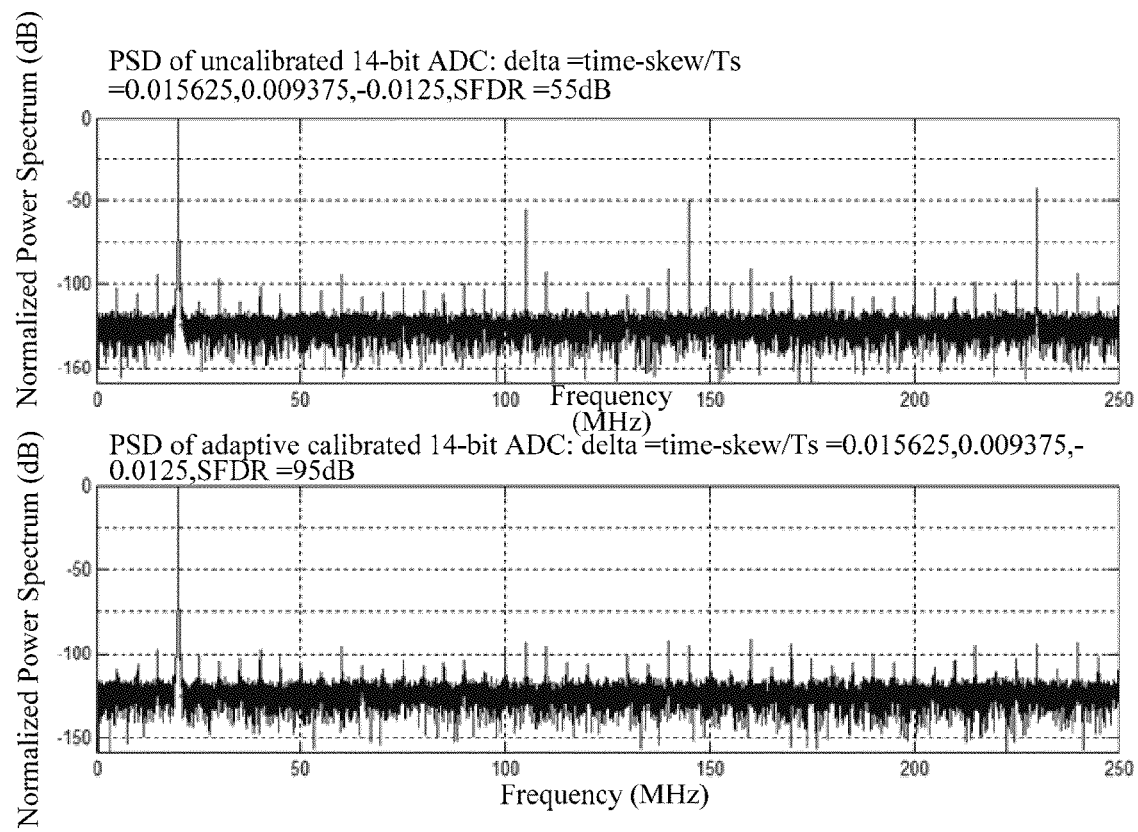
FIG. 12 is a performance index comparison diagram of an analog-to-digital converter according to an embodiment of the present invention.

By using the channel timing skew error detection circuit proposed in the present invention, dynamic performance of the time-interleaved ADC can be improved very effectively. In FIG. 12, an effect of performance simulation of a four-channel time-interleaved ADC (whose resolution is 14 bits) to which the method of the present invention is applied is given. The system equivalent sampling frequency $f_s$=500 MHz (the sampling cycle $T_s$=2 ns), and normalized timing skew errors of ADC1, ADC2, and ADC3 of the channels are 0.015625, 0.009375, and −0.0125, respectively. In addition, an input signal for test is a sine wave with a frequency of $f_i$=20 MHz. Theoretically, it can be proven that, when a frequency of an input signal is $f_i$=20 MHz and an equivalent sampling frequency is $f_s$=500 MHz, timing skew errors generate 3 distorted spectrums on an output signal spectrum of the four-channel time-interleaved ADC, which are separately located at 105 MHz, 145 MHz, and 230 MHz, as shown in an upper half of FIG. 12.

As may be seen from FIG. 12, when a timing skew error correction is not performed by applying the present invention, an SFDR (Spurious Free Dynamic Range, spurious free dynamic range) of the time-interleaved ADC is only 55 dB (the upper half of FIG. 12). However, after the timing skew error correction is performed by using this embodiment of the present invention, the SFDR of the time-interleaved ADC is increased to 95 dB (a lower half of FIG. 12).

For the analog-to-digital converter provided in the embodiments of the present invention, there is no special requirement for a spectrum of an input signal, a sampling frequency of an ADC of each channel does not need to individually meet the Nyquist criterion, and instead in a case in which an equivalent sampling frequency output by a combination in a time-interleaved ADC meets the Nyquist criterion, a timing skew error of a channel can be accurately calculated, and correction and compensation are performed on a signal generated by an ADC of each channel, to output a correct signal.

In the foregoing specific implementation manners, the objective, technical solutions, and benefits of the present invention are further described in detail. It should be understood that the foregoing descriptions are merely specific implementation manners of the present invention, but are not intended to limit the protection scope of the present invention. Any modification, equivalent replacement, or improvement made without departing from the spirit and principle of the present invention should fall within the protection scope of the present invention.

What is claimed is:

1. A multi-channel time-interleaved analog-to-digital converter (ADC), comprising:
    a clock generation circuit, configured to generate a work clock of the analog-to-digital converter;
    a channel ADC group, comprising M ADC channels, arranged to be in a time-interleaved architecture, and configured to convert, under the control of the clock generation circuit and in a time division multiplexing manner, one high-speed analog input signal into M low-speed digital output signals, wherein M is an integer not less than 2, wherein sampling clocks of ADCs of adjacent subchannels in the M ADC channels have a phase difference of $2\pi/M$;
    a channel mismatch detection circuit, configured to detect in real time timing skew errors of output signals of the M ADC channels, to obtain a timing skew parameter of each ADC channel relative to a reference ADC channel;
    a signal compensation and reconstruction circuit, configured to perform, according to the timing skew parameters detected by the channel mismatch detection circuit, compensation and reconstruction on the digital output signals output by the channel ADC group; and
    a signal combining circuit, configured to combine the M low-speed output signals that are of the channels and generated after the compensation by the signal compensation and reconstruction circuit, to obtain one final high-speed digital output signal.

2. The multi-channel time-interleaved analog-to-digital converter according to claim 1, wherein the channel mismatch detection circuit further comprises:
    a notch filter, configured to perform notch filtering on the output signals of the M ADC channels;
    a mismatch error discriminator, configured to perform mismatch error discrimination according to an output result of the notch filter;
    an alpha filter, configured to perform smooth filtering on the timing skew parameter generated by the mismatch error discriminator; and
    a mismatch error adaptive iterative circuit, configured to optimize an adaptive error value obtained through the smooth filtering, to obtain a timing skew error steady state value.

3. The multi-channel time-interleaved analog-to-digital converter according to claim 2, wherein the notch filter comprises:
    a first shift register, configured to shift an input signal to the right by 6 bits;
    a first delay circuit, configured to delay the input signal by one clock;
    a second shift register, configured to shift an output signal of the first delay circuit to the right by 6 bits;
    a first subtracter, configured to subtract an output of the first shift register from the input signal;
    a second subtracter, configured to subtract an output of the second shift register from an output of the first delay circuit;
    a first adder, configured to add an output of the second subtracter to an output of the first subtracter;
    a second delay circuit, configured to delay an output signal of the first adder by a clock cycle;

a third shift register, configured to shift an output signal of the second delay circuit to the right by 6 bits;

a third subtracter, configured to subtract an output of the third shift register from an output of the second delay circuit; and a third delay circuit, configured to delay an output of the third subtracter by a clock cycle, and use a delayed output as a final output signal of the notch filter.

4. The multi-channel time-interleaved analog-to-digital converter according to claim 2, wherein the mismatch error discriminator comprises:

a fourth subtracter, configured to subtract $x'\%_{i-1}(n)$ from a signal $x'\%_{i+1}(n)$ output by the notch filter; and a first multiplier, configured to multiply an output of the fourth subtracter by a signal $\bar{x}'_i(n)$ output by the notch filter, wherein n is time, i=1, 2, . . . , M−1, and M is a natural number not less than 2.

5. The multi-channel time-interleaved analog-to-digital converter according to claim 2, wherein the alpha filter comprises:

a fifth subtracter, configured to subtract $\delta'_i(n-1)$ from an output signal $\delta'\%_i(n)$ of the mismatch error discriminator;

a second multiplier, configured to multiply an output result of the fifth subtracter by an α factor;

a second adder, configured to add an output of the second multiplier and $\delta'_i(n)$; and a fourth delay circuit, configured to delay an output of the second adder by a clock cycle, wherein n is time, i=1, 2, . . . , M−1, and M is a natural number not less than 2.

6. The multi-channel time-interleaved analog-to-digital converter according to claim 2, wherein the mismatch error adaptive iterative circuit comprises:

a first operation circuit, configured to take a maximum value of a mismatch error value $\delta'_i$ of each channel output by the alpha filter;

a second operation circuit, configured to take the reciprocal of an output result of the first operation circuit;

a fifth delay circuit, configured to delay an output result of the second operation circuit by a clock cycle;

a third multiplier, configured to multiply an output of the fifth delay circuit by an output signal $\delta'_i(n)$ of the alpha filter;

a sixth delay circuit, configured to delay an output result of the third multiplier by a clock cycle;

a fourth multiplier, configured to multiply an output result of the sixth delay circuit by a constant μ;

a third adder, configured to add an output of the fourth multiplier to an output at a previous moment of the mismatch error adaptive iterative circuit; and a seventh delay circuit, configured to delay an output result of the third adder by a clock cycle, and use a delayed output result as a final timing skew error steady state value $\delta'_i(n)$, wherein n is time, i=1, 2, . . . , M−1, and M is a natural number not less than 2.

7. The multi-channel time-interleaved analog-to-digital converter according to claim 2, further comprising an energy detector, wherein the energy detector is configured to perform an absolute value operation on an output value of a reference channel, then subtract a set threshold after performing filtering using the alpha filter, and transmit, as a final output to the mismatch error discriminator, a symbol of an operation result obtained after the set threshold has been subtracted, wherein when a high level is output, the mismatch error discriminator works normally, and when a low level is output, a current parameter is blocked, and a previous discrimination value is used.

8. The multi-channel time-interleaved analog-to-digital converter according to claim 2, further comprising a timing control circuit, configured to control a work process of the analog-to-digital converter.

\* \* \* \* \*